United States Patent [19]

Hsu

[11] Patent Number: 5,805,003
[45] Date of Patent: Sep. 8, 1998

[54] CLOCK FREQUENCY SYNTHESIS USING DELAY-LOCKED LOOP

[75] Inventor: Chuan-Ding Arthur Hsu, San Jose, Calif.

[73] Assignee: Cypress Semiconductor Corp., San Jose, Calif.

[21] Appl. No.: 921,420

[22] Filed: Aug. 29, 1997

Related U.S. Application Data

[63] Continuation of Ser. No. 551,992, Nov. 2, 1995, abandoned.

[51] Int. Cl.⁶ .............................. H03K 5/13; H03K 5/159
[52] U.S. Cl. ........................ 327/270; 327/265; 327/261; 327/149; 327/158
[58] Field of Search ................................... 327/105, 107, 327/141, 147, 149, 150, 151, 152, 153, 155, 156, 158, 159, 160, 161, 175, 261, 269, 270, 265, 99, 407

[56] References Cited

U.S. PATENT DOCUMENTS

| | | | |
|---|---|---|---|
| 4,338,531 | 7/1982 | Corso | 327/175 |
| 4,626,716 | 12/1986 | Miki | 327/270 |
| 5,463,337 | 10/1995 | Leonowich | 327/158 |
| 5,491,673 | 2/1996 | Okayasu | 327/158 |
| 5,521,499 | 5/1996 | Goldenberg et al. | 327/261 |

*Primary Examiner*—Timothy P. Callahan
*Assistant Examiner*—Dinh Le
*Attorney, Agent, or Firm*—Maiorana & Acosta, P.C.

[57] ABSTRACT

A circuit for synthesizing, from a first signal having a first frequency, a second signal having a second frequency. This synthesis includes using a delay locked loop in combination with a minimal amount of logic circuitry to generate a synthesized output signal which is completely deterministic and does not require any analog control.

13 Claims, 4 Drawing Sheets

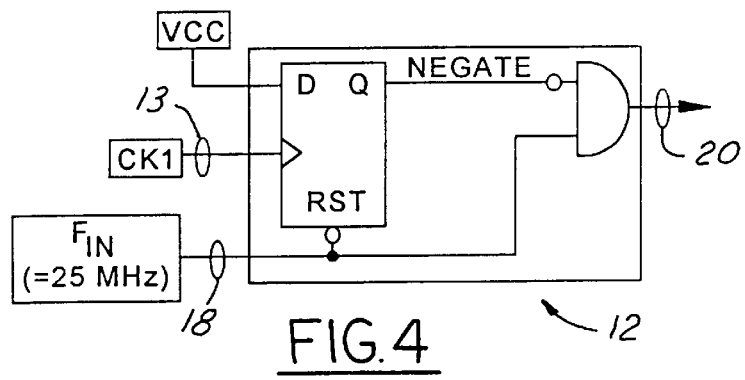
FIG.4
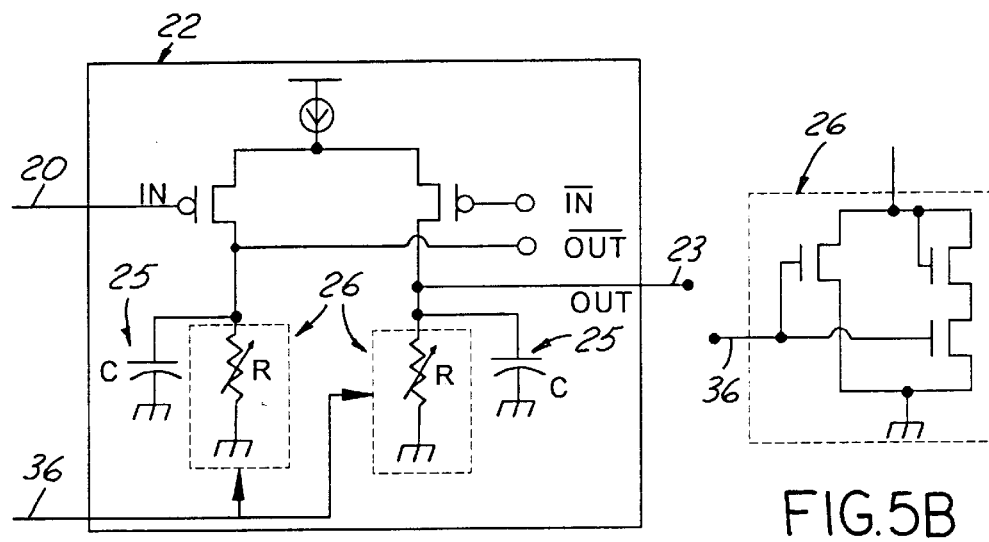
FIG.5A
FIG.5B
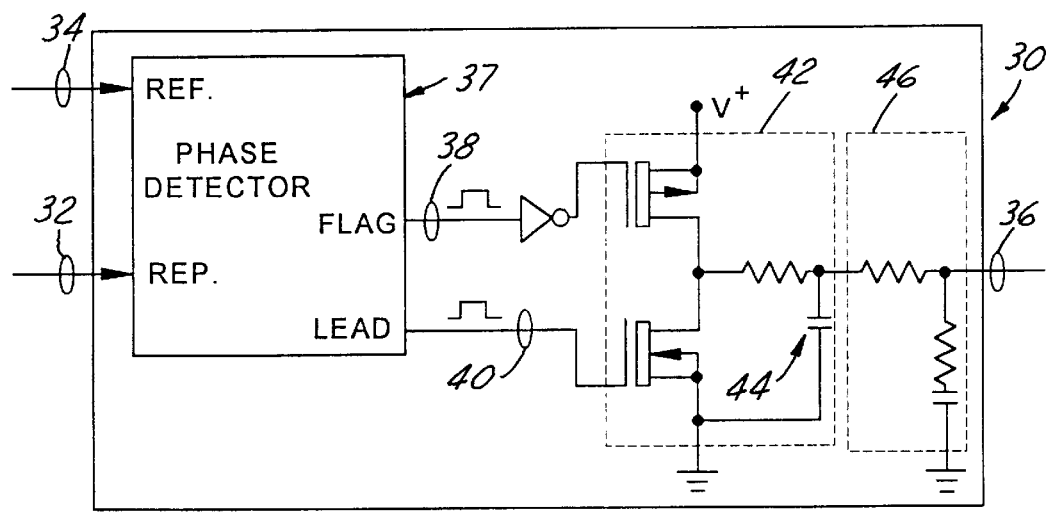
FIG.6

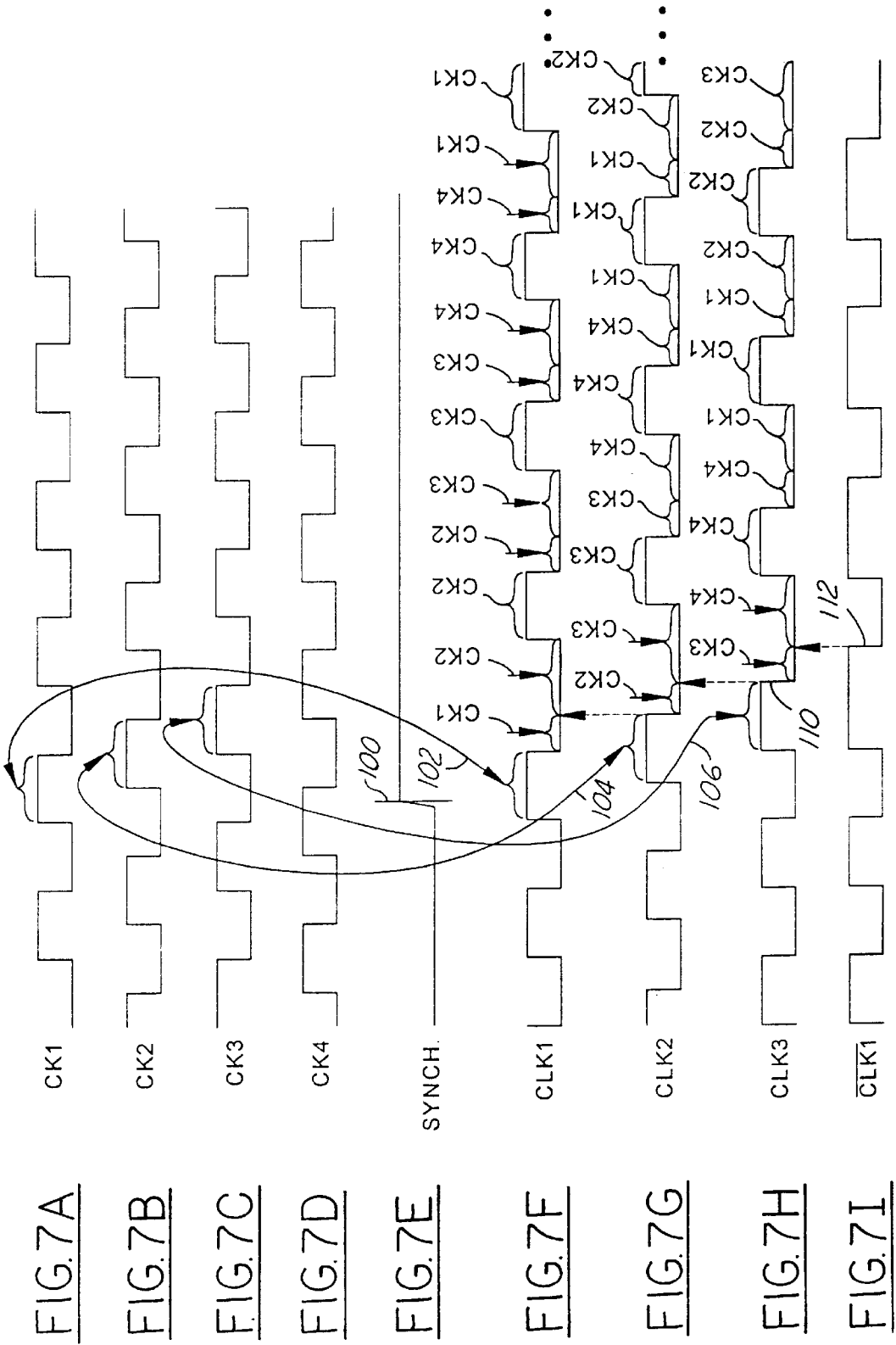

CLOCK FREQUENCY SYNTHESIS USING DELAY-LOCKED LOOP

This is a Continuation of U.S. patent application Ser. No. 08/551,992, filed Nov. 2, 1995, now abandoned.

TECHNICAL FIELD

This invention relates to frequency synthesizers and more particularly relates to frequency synthesizers which employ the use of a delay-locked loop.

BACKGROUND OF THE INVENTION

In many design applications there exists a need for two or more time bases (each having a different frequency). For example, there may exist a particular circuit which requires both a 25 MHz clock and a 20 MHz clock.

One approach commonly implemented for deriving dual time bases is to directly generate the first time base (using known techniques such as a crystal based timer) and then use a multiply-by-N/divide-by-M circuit to generate the second time base. One typical implementation of the multiply-by-N/divide-by-M circuit is to use a phase lock loop (PLL) to multiply the first time base and then use a logic divider to divide the output of the PLL to get the second time base. For example, if both a 25 MHz signal and a 20 MHz is needed, a 25 MHz signal is directly generated using known techniques and its output is fed to a PLL which is configured as a frequency multiplier to multiply the 25 MHz signal by a factor of four to generate an output of 100 MHz. This 100 MHz signal is then sent through a divide-by-5 logic circuit to generate the 20 MHz clock signal. This type of circuit is depicted in FIG. 1. One of the drawbacks with this approach is that the high frequency logic needed to divide 100 MHz signal by N may be difficult to implement depending on the process used to fabricate the integrated circuit.

Alternatively, the 25 MHz clock can first be sent through a divide-by-5 logic circuit to generate a 5 MHz signal which is in turn fed into a PLL circuit arranged in a multiply-by-4 mode to generate the 20 MHz clock signal This implementation is shown in FIG. 2. One drawback with this implementation is that the loop filter must employ a relatively large capacitor because of the low frequency involved.

It is therefore an object of this invention to set forth a simple means for synthesizing a second clock signal from a first clock signal.

The system of the present invention can easily accomplish this objective by using a delay locked loop and can be used for synthesizing any frequency which is an integer multiple and/or and integer divisor of an existing clock signal.

SUMMARY OF THE INVENTION

The clock frequency synthesis circuit of the present invention includes a time delay circuit for receiving a signal having a first frequency and generating therefrom at least two phase delayed signals. Connected to the time delay circuit is a first multiplex circuit having one output line and a respective input line for each of said at least two said phase delayed signals. A first counter-circuit is coupled to the first multiplex circuit for commanding which of said input lines of said first multiplex circuit is electrically connected to said output line of said first multiplex circuit. Means for incrementing the counter circuit is connected to the input of the storage circuit. This incrementing means is responsible for incrementing the counter circuit at an interval which causes the signal present on the output line of the first multiplex circuit to have a second frequency.

Preferably, the incrementing means includes a second multiplex circuit and a second counter circuit. The second multiplex circuit includes one output line and a respective input line for each of said at least two phase delayed signals. Preferably, the second counter circuit includes an input line and an output line wherein the output line of the second counter is coupled to the second multiplex circuit.

In a preferred embodiment, the circuit further includes a phase detector and a loop filter for ensuring proper phase delay between the input signal and the phase delay signals.

Still in a preferred embodiment, the circuit of the present invention includes a duty cycle ensurer circuit coupled between the time delay circuit and the input signal. The duty cycle ensurer circuit ensures that the duty cycle of the input signal is limited to less than a predetermined percentage.

BRIEF DESCRIPTION OF THE DRAWINGS

FIG. 4 is a preferred embodiment of the Duty Cycle Ensurer Circuit of the present invention.

FIGS. 5A and 5B disclose a preferred embodiment of the delay circuit of the present invention.

FIG. 6 is a functional depiction of circuit 30 of FIG. 3.

FIGS. 7A–7I set forth the timing diagrams for the electrical signals present in the circuit of FIG. 3.

DETAILED DESCRIPTION OF THE PREFERRED EMBODIMENTS

Figure 1:
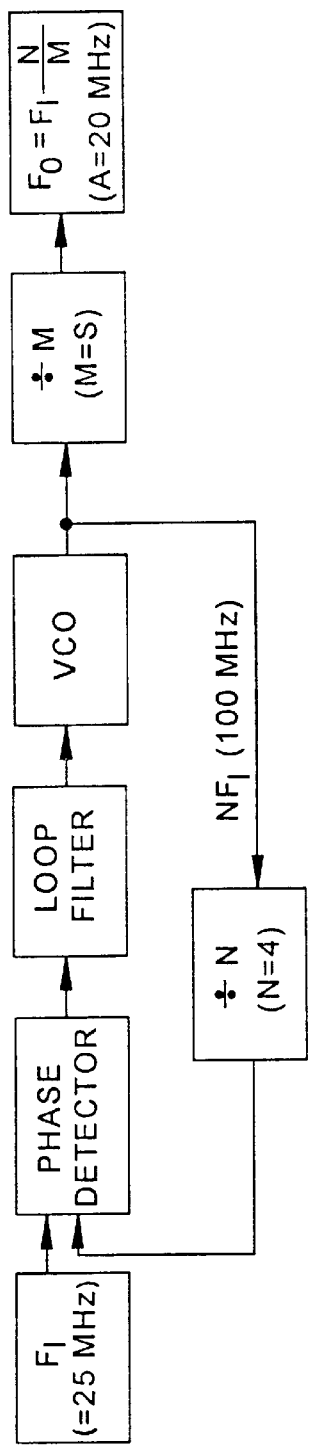
FIG. 1 and 2 are prior art implementations of clock generating circuits using PLL's.
Figure 2:
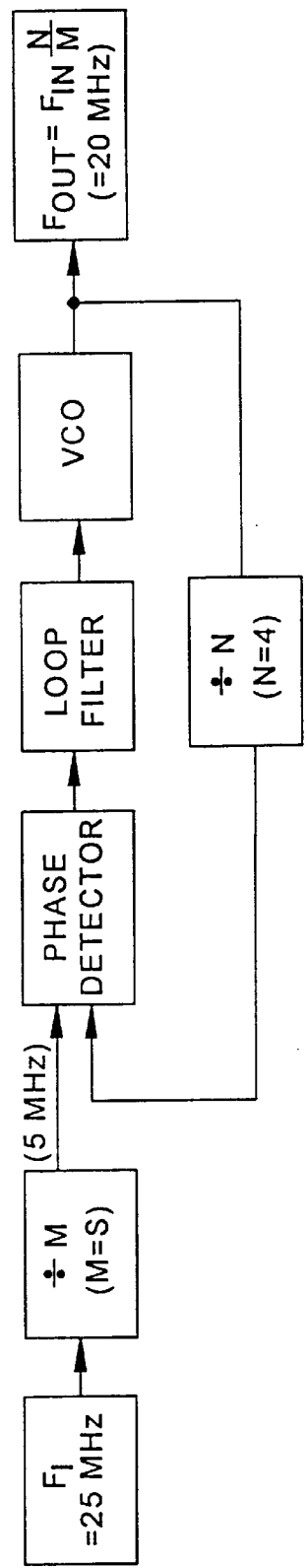
Figure 3:
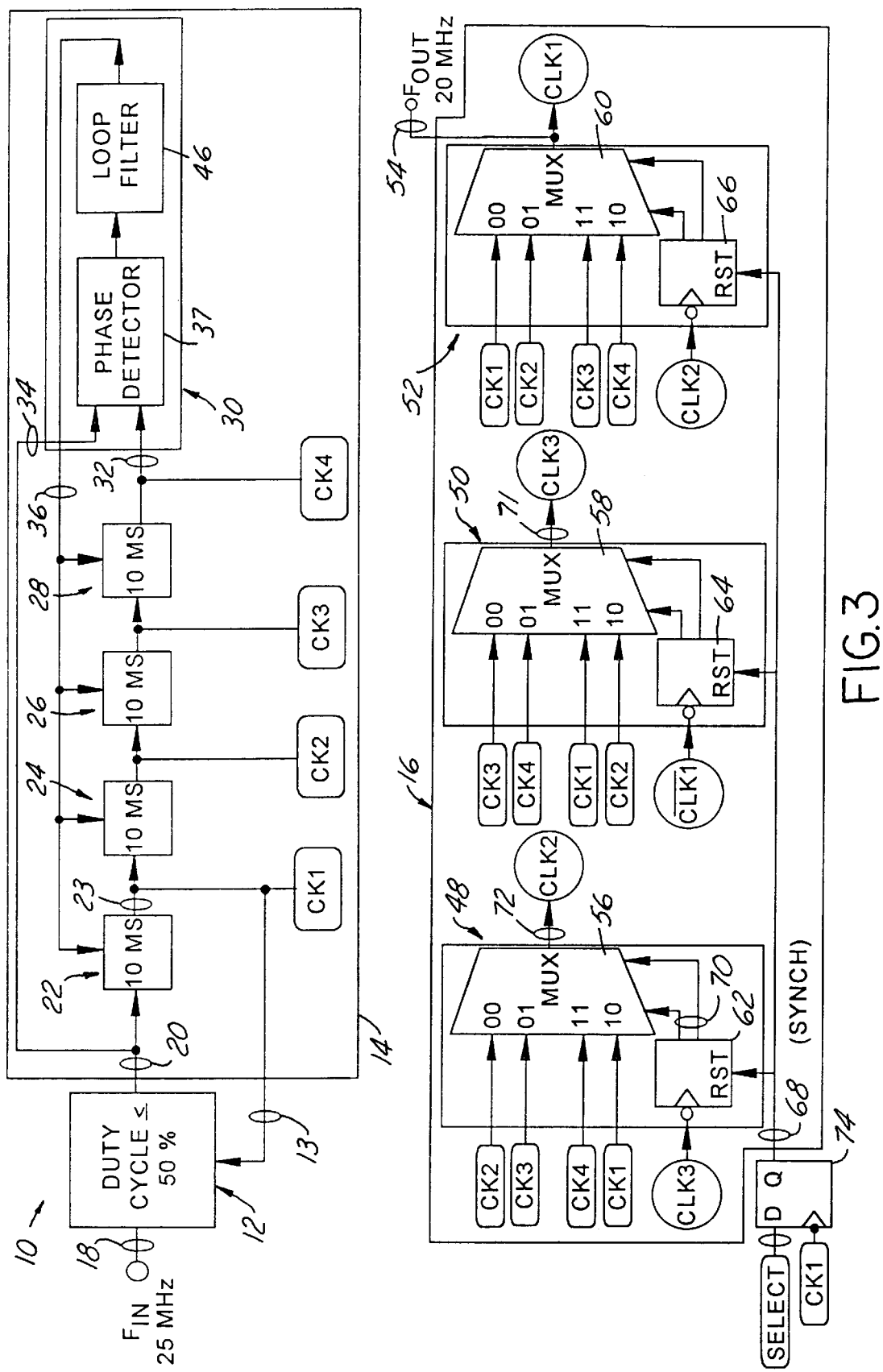
FIG. 3 is a schematic diagram of the circuit of the present invention as it is implemented for synthesizing a 20 MHz output signal from a 25 MHz input signal.

Now referring to FIG. 3, synthesizing circuit 10 is comprised of the following three building blocks—duty cycle ensurer circuit 12, delay generator circuit 14, and recombining circuit 16. The operation of these three fundamental building blocks will now be explained.

Duty Cycle Ensurer Circuit

Duty cycle ensurer circuit 12 operates to ensure that the signal fed out on line 20 to delay generator circuit 14 never exceeds a duty cycle of 50% (i.e. duration of logic high cannot exceed logic low). Thus, if the input signal 18 does exceed a 50% duty cycle, circuit 12 will limit the duty cycle of signal 20 to 50% or less. It is imperative to the proper operation of recombining circuit 16 that circuit 14 be fed with a signal having a duty cycle of 50% or less. A preferred embodiment of duty cycle ensurer 12 is shown in FIG. 4. This implementation guarantees that the duration for which the clock 12 is high is approximately 10 ns. This is well below the 50% duty cycle time for a 25 MHz signal.

Delay Generator Circuit

Now referring to FIG. 3, delay generator circuit 14 is essentially comprised of a delay-locked loop and generates four output waveforms CK1, CK2, CK3, and CK4 each having a frequency identical to that of the signal present on line 20, but each having a fixed phase delay as shown in FIGS. 7A–7D. Thus, CK1 is a 25 MHz signal which is phase shifted (delayed) by-10 ns from that of signal 20. This delay is implemented by delay circuit 22. One preferred embodiment of delay circuit 22 is shown in FIGS. 5A and 5B. Obviously, there are many ways to implement the delay element 22 but the circuit of FIG. 5A uses a capacitor/resistor combination 25, 26 respectively to delay the time it takes the signal present on input line 20 to arrive on output line 23. Resistor 26 is a voltage control resistor which, in a preferred embodiment, is fabricated using FET's as shown in FIG. 5B.

Thus, it can be seen that as signal 20 is sequentially passed-through four stages (delay circuits 22–28), wherein each output which results at each stage further delays the signal by 10 ns.

Although each delay circuit 22–28 introduces a 10 ns delay to the signal it receives, the ions delay provided by each circuit 22–28 is subject to some degree of variance and/or drift. Thus, if this error is permitted to compound, under worse case conditions, output CK4 may fall outside of acceptable timing limits needed for proper, stable operation of circuit 10. Thus, detector/filter circuit 30 is employed to guarantee a precise delay of one period between the signal on line 20 and the signal on line 32. Because the delay elements 22–28 are identical and controlled by the same voltage, theoretically all the delay elements have same delay increment. Circuit 30 will adjust the feedback control voltage on line 36 so that the cumulative delay of delay elements 22–28 is equal to the period of $f_{IN}$.

Circuit 30 accomplishes this as follows. Input signals 32 and 34 are provided to phase detector 37 (see FIG. 6). Phase detector 36 compares the phases of input signals 32 and 34 and generates a lag signal along line 38 if signal 32 lags the reference signal (signal 34 in this case). If the replica signal leads the reference signal, a lead signal is generated along line 40. Lead 40 signal and lag 38 signals control charge pump circuit 42 such that the voltage developed across capacitor 44 is proportional to the lead/lag (or phase) error detected between the reference signal and the replica signal. The output from charge pump 42 is filtered by low pass filter 46 and the output of low pass filter 46 is delivered to each delay circuit 22–28 and used therein to adjust the delay time introduced by each circuit 22–28.

Recombining Circuit

Now referring to FIG. 3, recombining circuit 16 is comprised of three identical blocks of decoding logic—48, 50, and 52. The function of recombining circuit 16 is to accept the 4 clock signals (25 MHz) CK1–CK4 generated by delay generator circuit 14 and to produce therefrom a 20 MHz output signal on line 54. Recombining circuit 16 accomplishes this task as follows. Each decoding logic circuit 48–52 is comprised of multiplexer 56, 58, 60, respectively and Gray code counter 62, 64 and 66 respectively. Focusing on decoding logic block 48, clock signals CK1–CK4 are applied as inputs to mux 56. Output lines 70 of Gray code counter 62 control which of the four inputs on lines CK1–CK4 are deposited on output line 72 of mux 56. As long as line 68 (SYNCH) is low, the output of Gray code counter 62 is forced to "00" and mux 56 passes the signal present on CK2 to CLK2. Likewise when SYNCH is low, mux 58 passes the signal present on CK3 to CLK3 and mux 60 passes the signal present on CK1 to CLK1. Thus $f_{OUT}$= $f_{IN}$. However, when line 68 goes high counter 62 controls mux 56 as follows.

Now referring to FIG. 3 and FIGS. 7A–7I after the SYNCH signal goes high 100, the concurrent high duration of CLK1 (output of mux 60) tracks 102 the high duration of CK1. This is due to the fact that until counter 66 receives a negative edge transition from the CLK 2 output, mux 60 remains in the "00" state wherein CK1 is passed through mux 60 to CLK1. The same analysis is applicable 104 to the high duration of CK2 with respect to CLK2 and 106 CK3 with respect to CLK3. Upon the negative edge transition 108 of CLK2 counter 66 is advanced from the "00" state to "01" state. Thus mux 60 is advanced to form a connection between CK2 and output line 54, and at this transition, the signal present on CLK1 ceases to track CK1 but rather begins to track CK2. Likewise, negative transition 110 of CLK3 causes the signal present on line 72 to switch over from CK2 to CK3. Likewise, negative edge transition 112 of CLK1 causes the signal present on output line 71 of mux 58 to switch from CK3 to CK4.

A review of the period of signals CLK1 through CLK3 shows that after transition 100 of the SYNCH line they all have a period of 50 ns (20 ns high and 30 ns low). This is 10 ns longer than signals CK1 through CK4. Thus, it has been demonstrated that the circuit of FIG. 3 is effective for generating an $f_{OUT}$ signal which has a different period from an $f_{IN}$ signal.

The foregoing detailed description shows that the preferred embodiments of the present invention are well suited to fulfill the objects of the invention. It is recognized that those skilled in the art may make various modifications or additions to the preferred embodiments chose here to illustrate the present invention, without departing from the spirit of the present invention. Accordingly, it is to be understood that the subject matter sought to be afforded protection hereby should be deemed to extend to the subject matter defined in the appended claims, including all fair equivalents thereof.

I claim:

1. A circuit for generating an output signal having a second frequency from an input signal having a first frequency comprising:

means for generating a plurality of replica signals in response to said input signal, each of said plurality of replica signals having said first frequency and (i) a delay time with respect to said input signal and (ii) a period;

means for generating said output signal having said second frequency in response to said replica signals, wherein said first and second frequencies are different, said means for generating said output signal including a plurality of multiplexers each generating a respective output signal selected from said plurality of replica signals in response to a selecting signal which is a feedback signal of an output from another of said multiplexers, wherein each of said output signals comprises (a) said period of said selected replica signal plus (b said time delay followed by (ii) a another one of said replica signals, whereby said output signal comprises one of said outputs from said multiplexers and has said second frequency.

2. The circuit of claim 1 further including a phase detector and loop filter coupled to said means for generating said replica signals.

3. The circuit of claim 1, further including a duty cycle circuit coupled between said means for generating said replica signals and said input signal, said duty cycle circuit for limiting a duty cycle of said input signal to less than a predetermined percentage determined as a difference between said first and second frequencies.

4. The circuit according to claim 1, further comprising a counter to present said selecting signal in response to said feedback signal.

5. The circuit of claim 4, further including means for enabling said counter.

6. The circuit according to claim 4, wherein said counter comprises a gray code counter.

7. A circuit for generating an output signal having a second frequency from an input signal having a first frequency comprising;

a phase-locked loop for generating a plurality of replica signals in response to said input signal, each of said plurality of replica signals having said first frequency and (i) a delay time with respect to said input signal and (ii) a period;

a circuit to generate said output signal having said second frequency in response to said replica signals, wherein said first and second frequencies are different, said circuit including a plurality of multiplexers each generating a respective output signal selected from said plurality of replica signals in response to a selecting signal which is a feedback of an output from another of said multiplexers, wherein each of said output signals comprises (a) said period of said selected replica signal plus (b) said time delay followed by another one of said replica signals, whereby said output signal comprises one of said outputs from said multiplexers and has said second frequency.

8. The circuit of claim 7, wherein said phase-locked loop further comprises a phase detector and loop filter.

9. The circuit of claim 7, further including a duty cycle circuit coupled between said phase-locked loop and said input signal, said duty cycle circuit for limiting a duty cycle of said input signal to less than a predetermined percentage determined as a difference between said first and second frequencies.

10. The circuit according to claim 7, further comprising a counter to present said selecting signal in response to said feedback signal.

11. The circuit of claim 10 further including a circuit to enable said counter.

12. The circuit according to claim 10, wherein said counter comprises a gray code counter.

13. A method for generating an output signal having a second frequency from an input signal having a first frequency comprising the steps of:

generating a plurality of replica signals, each of said replica signals having (i) a time delay with respect to said input signal and (ii) a period; and generating a plurality of second signals, each in response to said plurality of replica signals wherein said second signals are generated from said replica signals in response to a selecting signal which is a feedback of another of said second signals, wherein each of said second signals comprises (a) said period of said selected replica signal plus (b) said time delay followed by another one of said replica signals, whereby said output signal comprises one of said second signal and has said second frequency.

* * * * *